(12) United States Patent
Chou

(10) Patent No.: US 6,298,003 B1
(45) Date of Patent: Oct. 2, 2001

(54) BOOST CIRCUIT OF DRAM WITH VARIABLE LOADING

(75) Inventor: Min-Chung Chou, Hsinchu (TW)

(73) Assignee: Elite Semiconductor Memory Technology, Inc, Hsinchu (TW)

( * ) Notice: Subject to any disclaimer, the term of this patent is extended or adjusted under 35 U.S.C. 154(b) by 0 days.

(21) Appl. No.: 09/758,931

(22) Filed: Jan. 11, 2001

(51) Int. Cl.[7] ...................................................... G11C 8/00
(52) U.S. Cl. .................... 365/230.06; 365/203; 365/194; 365/233; 365/222
(58) Field of Search ............................... 365/230.06, 203, 365/194, 233, 222, 149

(56) References Cited

U.S. PATENT DOCUMENTS 6,104,665 * 8/2000 Hung et al. ...................... 365/230.06

* cited by examiner

Primary Examiner—David Nelms
Assistant Examiner—David Lam

(74) Attorney, Agent, or Firm—Baker Botts

(57) ABSTRACT

A boost circuit for driving word lines in a memory device, comprises: a delaying module for delaying signal to turn on a refresh cycle of the boost circuit; a precharge timing controlling module for controlling the timing of the refresh cycle, wherein the delay module transmitting the signal to the precharge timing controlling module for disabling and enabling the precharge timing controlling module; a precharge module for supplying charge to a first capacitor and a second capacitor, wherein the precharge module is controlled by the precharge timing controlling module; a first capacitor connected to the precharge module and charge the word lines for storing charges; when the precharge module stops to charge the first capacitor, the first capacitor starts to charge the word lines in 2k refresh mode and charge both of the word lines and the second capacitor in 4k refresh mode of the memory device; a second capacitor connected to the precharge module and charge the word lines for storing charges, wherein the second capacitor is connected to a controlling module for deciding to turn on the second capacitor, when the precharge module stops to charge the second capacitor, the second capacitor starts to charge the word lines in 2k refresh mode, but in 4k refresh mode of the memory device the first capacitor starts to charge the second capacitor and the word lines together.

17 Claims, 3 Drawing Sheets

2 of 4 sec# in 2k refresh, others=0
1 of 4 sec# in 4k refresh, others=0

BOOST CIRCUIT OF DRAM WITH VARIABLE LOADING

FIELD OF THE INVENTION

The present invention relates to a boost circuit in a DRAM device, more specifically, to a boost circuit in a DRAM device with variable loading.

BACKGROUND OF THE INVENTION

Referring to FIG. 1, a boost circuit of a dynamic-random-access memory (DRAM) device for driving word lines of the device is shown. A signal CLK1 is input into a delay circuit for turning on the refresh cycle of the DRAM device. The delay circuit transmits an output signal through an inverter 10 to connect to a precharge timing controlling circuit. Furthermore, the signal CLK1 simultaneously input into the precharge timing controlling circuit for preseting the precharge timing controlling circuit and the output signal from the delay circuit disables the precharge timing controlling circuit.

The capacitor C is charged by a precharge circuit when the delay circuit output signal to enable the precharge timing controlling circuit and the precharge circuit is controlled by the precharge timing controlling circuit. When the output signal from the delay circuit is transmitted from the inverter 10 to the precharge timing controlling circuit, the charging process of the capacitor C is stopped and then discharges to charge the word lines of the memory device.

Referring to FIG. 2, it shows a time sequence for operating the boost circuit in a DRAM device. The time sequence mentions the five voltage levels applying in the boost circuit in accordance to FIG. 1 and the five voltage levels includes VPP1, CLK1, A1, T1 and secO.

Still referring to FIG. 2, when signal CLK1 is high level on t1 time, the precharge timing controlling circuit is presented by CLK1 and T1 that is the signal CLK1 output from the delay circuit into the inverter 10, the inverter 11 and output from the inverter 12. The signal CLK1 is transmitted from the delay circuit, the inverter 10 to disable the precharge timing controlling circuit and the charging process of the capacitor C. That is, when A1 is low level on t2 time, the precharge timing controlling circuit is disable to turn off the charging process of the capacitor by using the precharge circuit. When the charging process of the capacitor is stopped as the outputting signal A1 is low level on t2 time, the capacitor C discharge to charge the word lines of the memory device. Only one section is selected in FIG. 2 shown, so the word line loading for the capacitor C to charge is only Cw where Cw is the capacitance of one unit word line loading.

In the charging process of the word lines in the memory device, the signal CLK1 goes low to enable the precharge timing controlling circuit since the signal A1 goes high on t3 time. When the precharge timing controlling circuit is enabled, the VPP1 is on precharge level for stopping the charging process of the word lines.

According to the above discuss, the boost circuit according to FIG. 1 just provides one kind of refresh mode which is 2k or 4k refresh mode, that is the loading is nonvariable. In the following descriptions, three U.S. patents, which describe the boost circuit in a memory device, is discussed.

Kaneko et al. discloses a semiconductor memory device in U.S. Pat. No. 5,587,958, which is filed on Dec. 27, 1994, entitled as "Semiconductor memory device including a boost potential generation circuit". Kaneko et al. describes a semiconductor integrated circuit device including a boost potential generation circuit and the boost potential generation circuit steadily generates a higher boost potential than an externally applied voltage. Moreover, the boosted potential generating apparatus includes a plurality of boosted potential generating circuits whose output terminal are connected in common, the plurality of boosted potential generating circuits are selected by a control apparatus so that the current supply capability is set in accordance with the number of word lines driven at a time.

Nagase discloses a semiconductor device in U.S. Pat. No. 5,373,475, which is filed on Aug. 6, 1992, entitled as "Semiconductor device in which the number of word lines selected simultaneously in a refresh mode is externally selectable and method of manufacturing the same". In this patent, Nagase mentions that a refresh mode switching signal generating circuit generates a refresh mode switching signal of an H level or an L level depending on whether a particular bonding pad is wire-bonded to a power supply terminal of a package. A refresh mode switching signal switches the refresh mode of a memory device according to the refresh mode switching signal.

Kim et al. filed a U.S. patent application, which is issued on Feb. 2, 1999 and whose Pat. No. is 5,867,442, on Dec. 19, 1996. The U.S. patent is entitled as "Variable output voltage booster circuits and methods". Kim et al. mentioned a method for controlling an internal booster power source in an integrated circuit memory device including a plurality of voltage booster active kickers.

SUMMARY OF THE INVENTION

The present invention discloses a boost circuit for driving word lines in a memory device. A delaying module is adapted for delaying a signal at right time to turn on a refresh cycle of the boost circuit and a precharge timing controlling module controls the timing of the refresh cycle, at the end of the refresh cycle the delay module transmits the signal to the precharge timing controlling module for enabling the precharge timing controlling module. Moreover, a precharge module supplies charges to the boost capacitors (first capacitor and second capacitor) and the precharge module is controlled by the precharge timing controlling module. A first capacitor is connected to the precharge module, a plurality of section decodes and to a second capacitor directly. The row address of DRAM decides which section decode to be selected and which word line to be charged. When the precharge module stops to charge the first capacitor, the first capacitor starts to charge loading in 2k and 4k refresh mode of the memory device. Furthermore, a second capacitor is connected to the precharge module and the same section decodes, wherein the second capacitor is connected to a controlling module for deciding to turn on the second capacitor, when the precharge module stops to charge the second capacitor, the second capacitor starts to chargeloading in 2k refresh mode or acts as a loading of the first capacitor in 4k refresh mode of the memory device.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PRESENT INVENTION

The present invention discloses a boost circuit in a memory device, especially in a DRAM device. The boost circuit consists of a delay module, a precharge timing controlling module, a precharge module, a first capacitor and a second capacitor. The delay module transmits signal to control the precharge timing controlling module to decide the charging timing sequence of the capacitors. Besides, the boost circuit is used in two refresh modes, which are 2k refresh mode and 4k refresh mode of the memory device. Moreover, the first capacitor is charged and discharged in every refresh cycle. The second capacitor is charged and discharged in 2k refresh mode. The capacitance of the capacitor C1 and C2 is calculated by using the specified formulas that is disclosed in the present invention.

Figure 3:
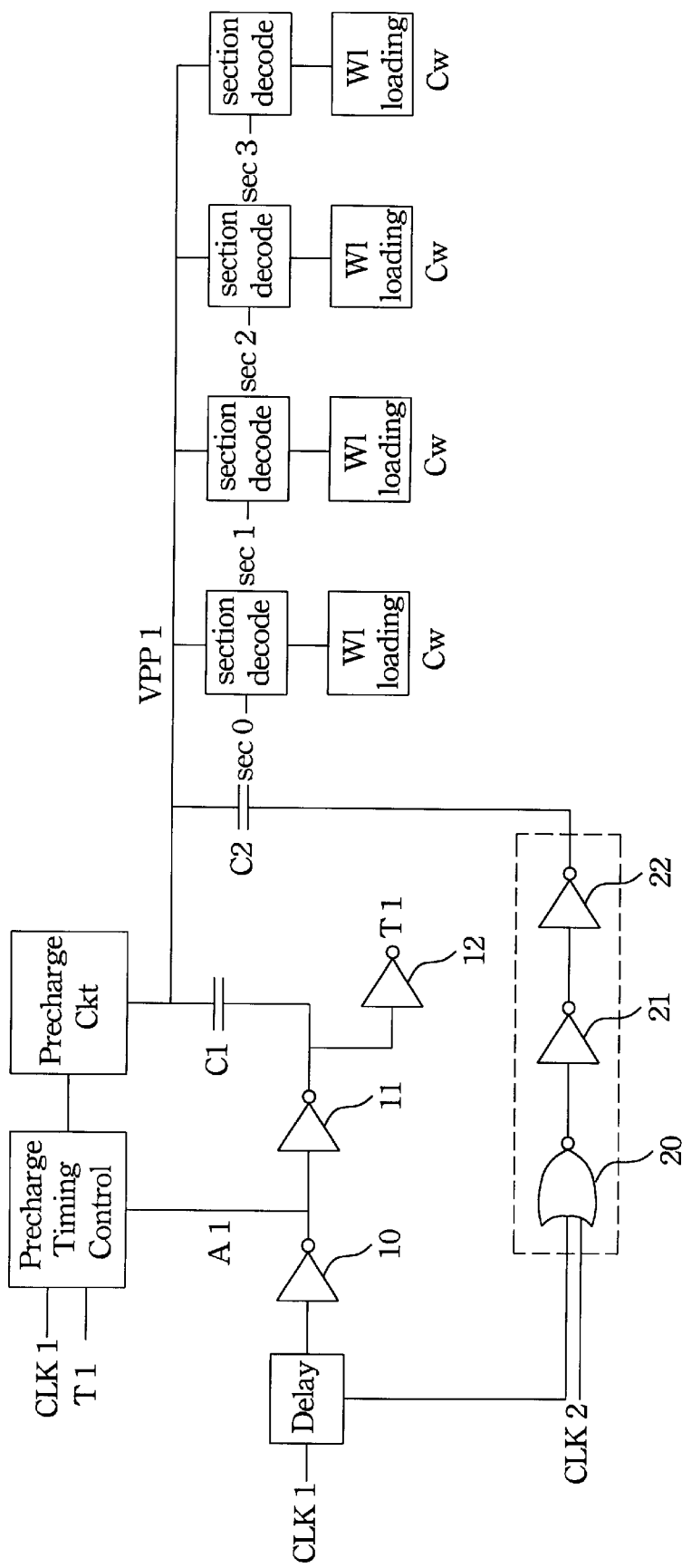
FIG. 3 shows a schematic of a boost circuit for driving word lines with variable loading in a memory device in accordance with the present invention.

Referring to FIG. 3, it shows a boost circuit for driving word lines in a memory device. The boost circuit consists of a delaying module, a precharge timing controlling means, a precharge module, a first charge storage and a second charge storage. The delay module is adapted for delaying signal CLK1 to turn on a refresh cycle of the memory device. In a preferred embodiment of the present invention, the delay module consists of several inverter devices and the number of the inverter devices is even. The signal CLK1 is input into the delay module and the precharge timing controlling module. Meanwhile, the precharge timing controlling module is presetted by the signal CLK1 and T1 that is refeedback from the inverter 12. The signal CLK1 that is transmitted by the delay module is input into the inverter 10. As the end of the refresh cycle, the inverter 10 output signal A1 to enable the precharge timing controlling module to charge the first charge storage, which is the capacitor C1 in FIG. 3. The capacitor C1 is charged by using the precharge module. Moreover, the precharge module is controlled by using the precharge timing controlling module.

Signal output from the inverter 10 is input into an inverter 11 and, is connected to an inverter 12 and to the capacitor C1. In other word, the charging process of the capacitor C1 is controlled by the signal output from the inverter 11 and the precharge module. Furthermore, the signal T1 output from the inverter 12 is feedback into the precharge timing controlling module for controlling the module, as mention previous this module is presetted by signal CLK1 and signal T1.

The signal output from the delay module that is same phase as signal A1 is input into a comparator 20 and another signal CLK2 is simultaneously input into the comparator 20. When the memory device is refreshed in 2k mode, the voltage level of the signal CLK2 is at low level from the delay module is transmitted through the comparator 20. When the memory device is refreshed in 4k mode, the voltage level of the signal CLK2 is at high level and the signal from the delay module can not be transmitted. The second charge storage, which is the capacitor C2 in FIG. 3, is always charged by using the precharge module in both 2k and 4k refresh mode and decided by signal CLK2 to be discharge to word lines or not. That is, when the memory device is refreshed in 2k mode, a second charge storage, which is the capacitor C2 in FIG. 3, is not charged by using the precharge module.

In the 2k refresh mode of the memory device, the signal CLK2 enables the comparator 20, then the signal from the delay module which is the other input of the comparator 20 is transmitted to the capacitor C2 through the comparator 20, an inverter 21 and an inverter 22. When the charging process of the capacitor C1 and the capacitor C2 is stopped in the 2k refresh mode of the memory device, the capacitors C1 and C2 discharge to charge the word lines of the memory device at the same time. The purpose of the inverter 21 and 22 is to compensate the timing delay between the capacitor C1 discharge and the capacitor C2 discharge, such that the capacitor C1 and C2 discharge to charge the word lines at the same time. Similarly, in the 4k refresh mode of the memory device, when the charging process of the capacitor C1 and the capacitor C2 is stopped, the capacitor C1 discharges to charge both of the word lines of the memory device and the capacitor C2.

Figure 1:
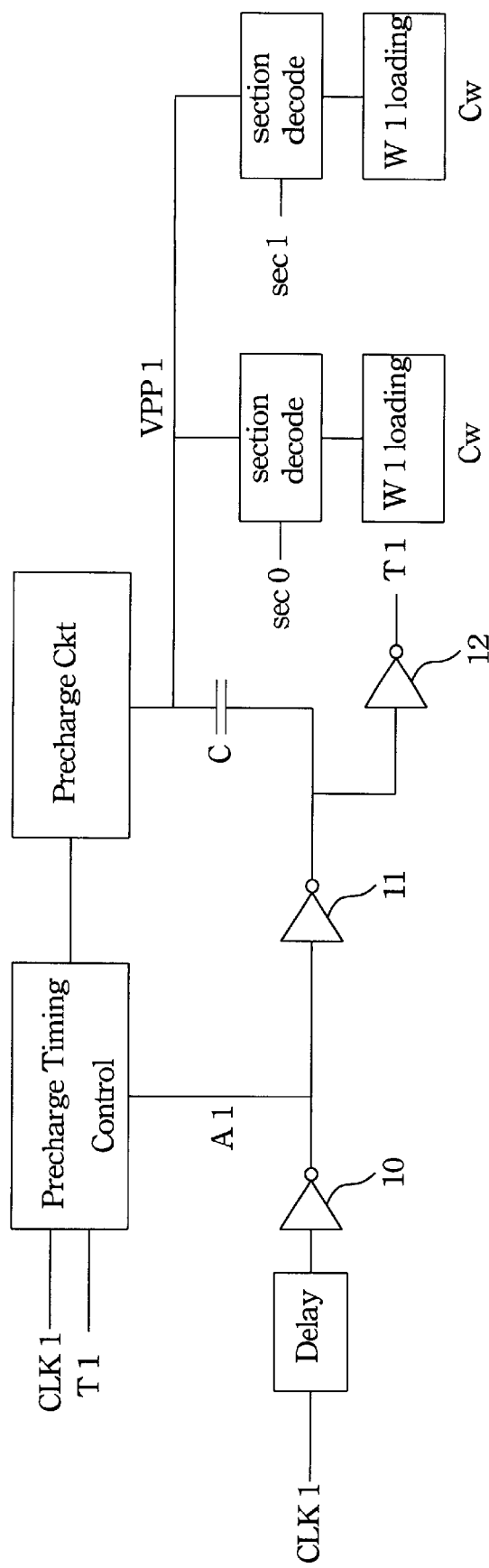
FIG. 1 shows a schematic diagram of a boost circuit for driving word lines in a memory device in accordance with prior art.
Figure 2:
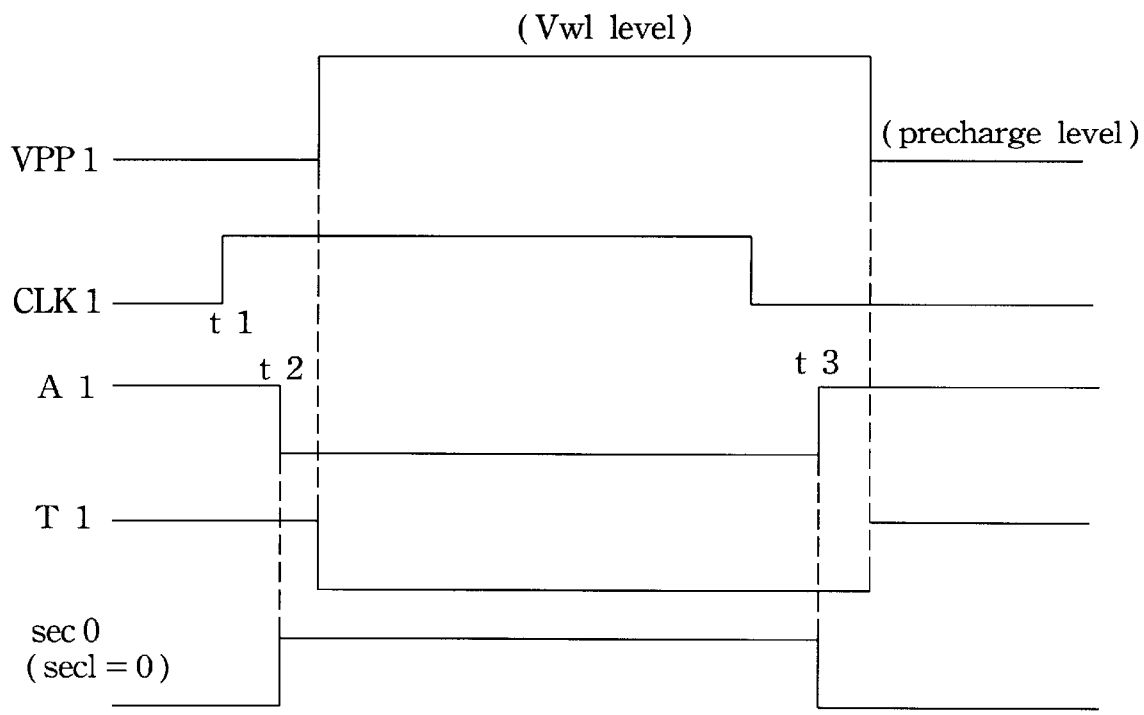
FIG. 2 shows the time sequence diagram for operating the modules in the boost circuit in accordance with prior art.
Figure 4:
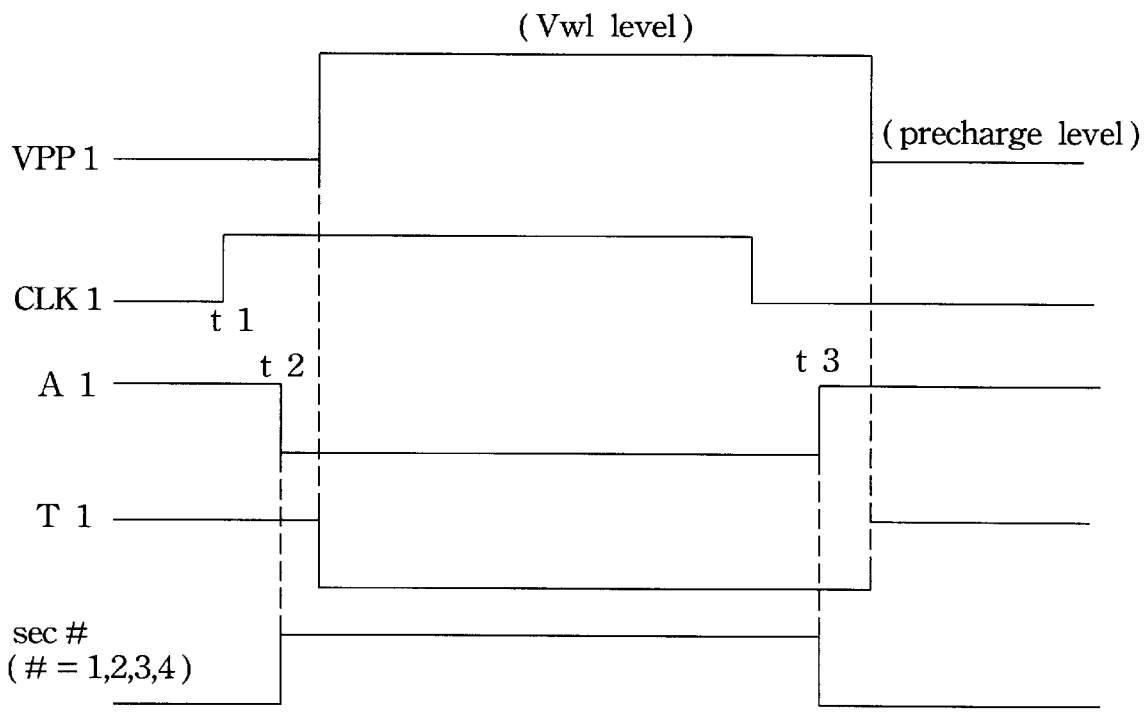
FIG. 4 shows the time sequence diagram for operating the modules in the boost circuit having variable-loading word lines in accordance with the present invention.

Referring to FIG. 4, it shows a time sequence diagram for operating the boost circuit in a DRAM device in accordance with the present invention. Furthermore, the time sequence diagram mentions the five voltage levels applying on five point of the boost circuit in accordance to FIG. 3 and the five voltage levels includes VPP1, CLK1, A1, T1 and sec0 (sec1, sec2 or sec3).

Still referring to FIG. 4, when the voltage level of signal CLK1 is high on t1 time, the precharge timing controlling circuit is presented and the signal CLK1 is transmitted from the delay circuit, the inverter 10 to disable the precharge timing controlling circuit. That is, when the voltage level of signal A1 is low on t2 time, the precharge timing controlling circuit is disable to turn off the charging process of the capacitor C1 and C2 by using the precharge circuit. The signal CLK1 is output from the delay circuit into the inverter 10, the inverter 11 to the inverter 12 for outputting signal T1 that combine with signal CLK1 to preset the precharge timing controlling circuit. In 2k refresh mode of the memory device, the voltage level of the signal CLK2 is low to enable the capacitor C2, such that the capacitor C2 can be boosted. Moreover, in 4k refresh mode of the memory device, the voltage level of the signal CLK2 is high to disable the comparator 20, result in the capacitor C2 is one part of loading for the capacitor. When the charging process of the capacitor C1 and the capacitor C2 is stopped as the outputting signal A1 is low level on t2 time, the capacitor C1 (and the capacitor C2) discharges to charge loading in 4k (2k) refresh mode of the memory device. In 2k refresh mode, the number of selected section is double of 4k refresh mode, so the word lines loading also double in 2k refresh mode. For example, in FIG. 3, 2k refresh mode active two of four sections, but only one section is selected in 4k refresh mode. Therefore, the word line loading in 2*Cw in 2k refresh and Cw in 4k refresh where Cw is the capacitance of one unit word line loading.

In the charging process of the word lines in the memory device, the signal CLK1 goes low to enable the precharge timing controlling circuit since the signal A1 goes high on t3 time. When the precharge timing controlling circuit is enabled, the VPP1 is on precharge level for stopping the charging process of the word lines. It is noted that when the voltage level of the signal VPP1 is high, it equal to the voltage Vw1 which is the voltage level that the word lines reaches after the discharging process of the capacitor(s).

In the 2k refresh mode of the memory device, the capacitance of the capacitor C1 and the capacitor C2 is determined by the following formula: $Vcc*(C1+C2)=Vw12Cw+(Vw1-Vcc)*(C1+C2)$. In the above formula, Vcc is the voltage level which is output from the precharge module and equal to the power supply, Vw1 is the voltage level of the word lines that we want to boost and Cw is the capacitance of one unit word line loading.

In the 4k refresh mode of the memory device, the capacitance C1 is calculated by the following formula: $Vcc*(C1+C2)=Vw1*(Cw+C2)+(Vw1-Vcc)*C1$. Furthermore, Vcc is the voltage level which is output from the precharge module and equal to the power supply, Vw1 is the voltage level of the word lines that we want to boost and Cw is the capacitance of the word lines of one unit word line loading.

While the preferred embodiment of the invention has been illustrated and described, it will be appreciated that various changes can be made therein without departing from the spirit and scope of the invention.

What is claimed is:

1. A boost circuit for driving word lines in a memory device, which comprises:
   delaying means for delaying a signal at right time to turn on a refresh cycle of said boost circuit;
   precharge timing controlling means for controlling the timing of said refresh cycle, wherein said delay means transmitting said signal to said precharge timing controlling means for disabling and enabling said precharge timing controlling means;
   precharge means for supplying charge, wherein said precharge means is controlled by said precharge timing controlling means;
   a first charge storage connected to said precharge means, charged by said precharge means and charging said word lines; and
   a second charge storage connected to said precharge means, charged by said precharge means and charging said word lines, wherein said second charge storage is connected to said precharge timing controlling means for deciding to turn on said second charge storage.

2. The circuit according to claim 1, wherein said first charge storage is turned on to charge said word lines in 2k and 4k refresh mode of said memory device.

3. The circuit according to claim 1, wherein said second charge storage is turned on to charge said word lines in 2k refresh mode of said memory device.

4. The circuit according to claim 1, wherein said second charge storage is charged by said first charge storage in 4k refresh mode of said memory device.

5. The circuit according to claim 1, wherein said precharge timing controlling means receives said signal which is transmitted from said delay means for deciding whether to turn on said second charge storage.

6. The circuit according to claim 1, wherein said precharge timing controlling means is reset by a signal which turns on a refresh cycle of said memory device.

7. The circuit according to claim 6, wherein said delay means transmits a first signal to enable said precharge timing controlling means and a second signal to disable said precharge timing controlling means.

8. The circuit according to claim 1, wherein said first charge storage and said second charge storage comprise capacitors.

9. The circuit according to claim 8, wherein the sum of the capacitance C1 of said first charge storage and the capacitance C2 of said second charge storage in 2k refresh mode are decided by the following formula:

$Vcc*(C1+C2)=Vw1*2Cw+(Vw1-Vcc)*(C1+C2)$, Vcc is the voltage level which is output from said precharge means and equal to power supply, Vw1 is the voltage level of said word lines after said refresh cycle, and Cw is the capacitance of one unit loading of said word lines.

10. The circuit according to claim 8, wherein the capacitance C1 of said first charge storage in 4k refresh mode is decided by the following formula:

$Vcc*(C1+C2)=Vw1*(Cw+C2)+(Vw1-Vcc)*C1$, Vcc is the voltage level which is output from said precharge means and equal to power supply, Vw1 is the voltage level of said word lines after said refresh cycle, Cw is the capacitance of one unit loading of said word lines and C2 is the capacitance of said second charge storage.

11. A boost circuit for driving word lines in a memory device, which comprises:
    delaying means for delaying a signal at right time to turn on a refresh cycle of said boost circuit;
    precharge timing controlling means for controlling the timing of said refresh cycle, wherein said delay means transmitting said signal to said precharge timing controlling means for disabling and enabling said precharge timing controlling means;
    precharge means for supplying charge, wherein said precharge means is controlled by said precharge timing controlling means;
    a first charge storage connected to said precharge means, charged by said precharge means and charging said word lines, when said word lines stops to charge said first charge storage, said first charge storage starts to charge said word lines in 2k refresh mode and to charge both of said word lines and said second charge storage in 4k refresh mode of said memory device; and
    a second charge storage connected to said precharge means, charged by said precharge means and charging said word lines, wherein said second charge storage is connected to controlling means for deciding to turn on said second charge storage, when said word lines in 2k refresh mode of said memory device stops to charge said second charge storage, said second charge storage starts to charge said word lines, in 4k refresh mode of said memory device, when said word lines stops to charge said second charge storage, said first charge storage starts to charge both of said second charge storage and said word lines.

12. The circuit according to claim 11, wherein said precharge timing controlling means receives said signal which is transmitted from said delay means for deciding whether to turn on said second charge storage.

13. The circuit according to claim 11, wherein said precharge timing controlling means is reset by a signal which turns on a refresh cycle of said memory device.

14. The circuit according to claim 13, wherein said delay means transmits a first signal to enable said precharge timing controlling means and a second signal to disable said precharge timing controlling means.

15. The circuit according to claim 11, wherein said first charge storage and said second charge storage comprise capacitors.

16. The circuit according to claim 15, wherein the sum of the capacitance C1 of said first charge storage and the capacitance C2 of said second charge storage in 2k refresh mode are decided by the following formula:

$Vcc*(C1+C2)=Vw1*2Cw+(Vw1-Vcc)*(C1+C2)$, Vcc is the voltage level which is output from said precharge means and equal to power supply, Vw1 is the voltage level of said word lines after said refresh cycle, and Cw is the capacitance of one unit loading of said word lines.

17. The circuit according to claim 15, wherein the capacitance C1 of said first charge storage in 4k refresh mode is decided by the following formula: $Vcc*(C1+C2)=Vw1*(Cw+C2)+(Vw1-Vcc)*C1$, Vcc is the voltage level which is output from said precharge means and equal to power supply, Vw1 is the voltage level of said word lines after said refresh cycle, Cw is the capacitance of one unit loading of said word lines and C2 is the capacitance of said second charge storage.

* * * * *